United States Patent [19]

Byrne

[11] Patent Number: 5,543,642
[45] Date of Patent: Aug. 6, 1996

[54] P-CHANNEL TRANSISTOR

[75] Inventor: Gerard Byrne, Rottenburg, Germany

[73] Assignee: Robert Bosch GmbH, Stuttgart, Germany

[21] Appl. No.: 476,058

[22] Filed: Jun. 7, 1995

Related U.S. Application Data

[63] Continuation of Ser. No. 232,135, Apr. 25, 1994, abandoned, which is a continuation of PCT/DE92/00794, Sep. 17, 1992.

[30] Foreign Application Priority Data

Oct. 23, 1991 [DE] Germany .......................... 4134879.6

[51] Int. Cl.$^6$ ................................................ H01L 23/62
[52] U.S. Cl. .......................... 257/356; 257/357; 257/355
[58] Field of Search .................... 257/356, 357, 257/355

[56] References Cited

U.S. PATENT DOCUMENTS 3,789,503  2/1974  Nishida et al. ................ 257/356

FOREIGN PATENT DOCUMENTS 0121096  10/1984  European Pat. Off. .
0319047  6/1989  European Pat. Off. .

OTHER PUBLICATIONS

Muller et al., *Device Elec for IC's*, pp. 455–457, 1986.
IEEE Electron Device Letters; vol. EDL-7, No. 1, Jan. 1986, New York, US, pp. 20–22; Noboru Shiono et al..

*Primary Examiner*—Stephen D. Meier
*Attorney, Agent, or Firm*—Kenyon & Kenyon

[57] ABSTRACT

A p-channel transistor has a drain electrode (12), a source electrode (13), a gate electrode (16) and a bulk electrode (14), the drain and source electrodes (12, 13) being constructed as p-regions in an n-well (10) and the well (10) itself being embedded in a surrounding p-region.

The bulk electrode is simultaneously the well terminal and is connected to the source electrode (13), while the drain electrode (12) is connected to the positive pole (U$^+$) of the operating voltage. This arrangement confers a reliable resistance to polarity reversal in conjunction with a minimum area requirement; even at relatively high temperatures, only negligible leakage currents flow; and, there is a need only for a single well (10) on which it is also possible to accommodate still other components.

8 Claims, 1 Drawing Sheet

P-CHANNEL TRANSISTOR

This application is a continuation of application Ser. No. 08/232,135, filed on Apr. 25, 1994 now abandoned; which is a continuation of PCT/DE92/00794 filed Sep. 17, 1992, still pending.

FIELD OF THE INVENTION

The present invention relates to a p-channel transistor having a drain electrode, a source electrode, a gate electrode and a bulk electrode, the drain and source electrodes being constructed as p-regions in an n-well, and the well itself being embedded in a surrounding p-region.

BACKGROUND INFORMATION

There may be a need for the n-well, which can contain the components such as resistors, capacitors, Z-diodes and MOS-transistors in bipolar and CMOS designs, to have a terminal with resistance to polarity reversal. Several techniques are known for achieving such a terminal with resistance to polarity reversal.

a) It is possible to provide a so-called floating well, in which although resistance to polarity reversal is ensured and it is also possible to accommodate other components, high leakage currents occur, in particular at relatively high temperatures. P-regions in this well can function as collectors or as well-carrying emitters. Such a p-region in the n-well becomes the emitter of a parasitic pnp-transistor whose collector current is the leakage current which flows between the n-well and the surrounding p-region.

b) A further possibility of achieving resistance to polarity reversal consists in connecting a collector element of a pnp-transistor to the n-well. However, this involves increased outlay on production and wiring, since the pnp-transistor has to be accommodated in a separate second well.

c) Resistance to polarity reversal can also be achieved by driving the well below the positive potential of the operating voltage ($U^+$), by a diode voltage, by interposing a pnp-diode. It is disadvantageous in this solution that the injection through other p-regions connected to $U^+$ cannot be completely prevented. In addition, a large area requirement is produced, in turn, in the case of production.

d) A further possibility consists in applying $U^+$ to the well via a resistor. In this case, however, in the event of polarity reversal there is a flow of current resulting from the resistance value. However, there is likewise a need for a relatively large area because of the relatively high resistance of the resistor.

SUMMARY OF THE INVENTION

The p-channel transistor according to the claim has the advantage that it is possible to achieve resistance to polarity reversal in conjunction with a low area requirement. In particular, the p-channel can be accommodated without a high area requirement in the same n-well in which still further components can also be accommodated, that is to say no additional well is required. The single well can be maintained at the potential $U^+$ (when operated without polarity reversal). Substrate leakage currents can therefore also be maintained very low at relatively high temperatures.

The bulk electrode is constructed as a p-channel arranged between the two p-regions of the drain and source electrodes. The p-region of the source electrode is contacted with an $n^+$-region in the well, in order to avoid the formation of a Schottky diode. In this case, the $n^+$-region expediently spatially adjoins the p-region.

The gate electrode is connected to a potential $U_G < U^+ - |U_{TH}|$, which is lower than the positive potential of the operating voltage, $U_{TH}$ being the threshold voltage of the p-channel. This condition is sufficient for the transistor to be driven. The voltage difference $U^+$-well potential thereby remains lower than a diode forward voltage, and it is therefore impossible to operate any parasitic pnp-transistor in the forward direction.

Since in most cases earth (ground) suffices as gate terminal, a simple arrangement can be provided. Since the gate requires no static current input, the p-insulation also suffices as the frame terminal (ground connection). In this case, the gate electrode is expediently contacted with a $p^+$-region in the p-insulation, in order to avoid the formation of a Schottky diode. As an alternative thereto, the gate electrode can also be contacted with a conductor track to which the frame (ground) potential or a potential higher than that can be applied in accordance with the previously mentioned condition.

BRIEF DESCRIPTION OFF THE DRAWINGS

FIG. 1 shows a plan view of the layout of the p-channel transistor according to the present invention, as an exemplary embodiment, FIG. 2 shows a sectional representation of the transistor represented in FIG. 1, in longitudinal section, and FIG. 3 shows a circuit diagram of the exemplary embodiment represented in FIGS. 1 and 2.

DETAILED DESCRIPTION

Figure 1:
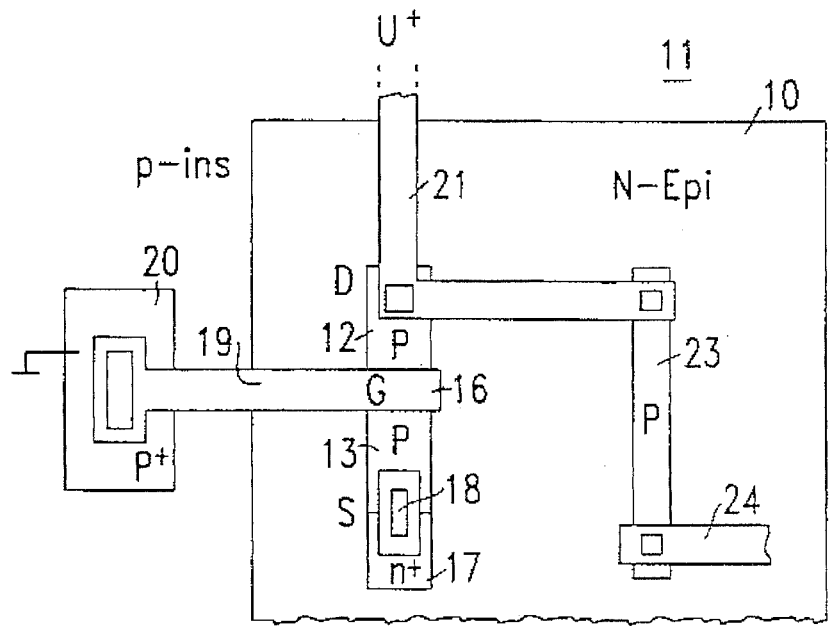

In the exemplary embodiment represented in FIGS. 1 and 2, an n-well 10 (denoted below as well) is embedded in a p-insulation region 11 (denoted below as p-ins). Two p-regions in the well 10 form the drain electrode 12 and the source electrode 13. These are connected to one another via a bulk electrode 14 constructed as a p-channel and likewise contained in the well 10 as a flat layer. A gate electrode 16, likewise constructed to be flat, is arranged over the bulk electrode 14 and separated by an insulating layer 15. In addition to the p-region forming the source electrode 13, an n+-region 17 is incorporated in the well and is connected to the source electrode 13 via an external contact arrangement (ohmic contact) 18. As a result, the source electrode 13 is connected (via the ohmic contact) to the well 10 without the formation of a Schottky diode. The gate electrode 16 is connected to the p-ins 11 via a connecting track 19 leading away to the side. For this purpose, the connecting track 19 ending above the p-ins 11 is contacted with a p+-region 20 which is incorporated in the p-ins 11 in order to avoid the formation of a Schottky diode. The p-ins 11 serves in this case as the frame terminal, since the gate electrode 16 requires no static current input.

The drain electrode 12 is contacted with a conductor track 21 which is connected to the positive pole $U^+$ of the operating voltage or to another voltage. This conductor track 21 leads, furthermore, to a resistor 23 which is constructed as a p-region, this p-region likewise being incorporated in the well 10. A further conductor track 24 is contacted with the other end of the resistor 23 and leads to further components (not represented). The resistor 23 is named, in this case, purely as an example of further components which can likewise be arranged in the same well 10.

Figure 2:
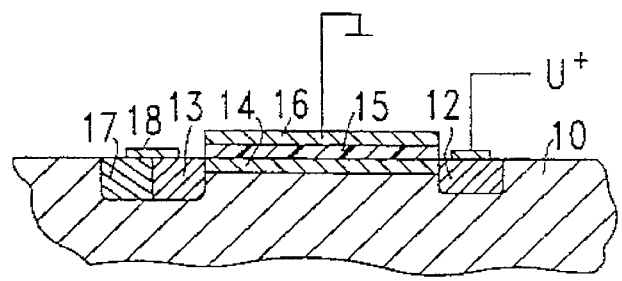
Figure 3:
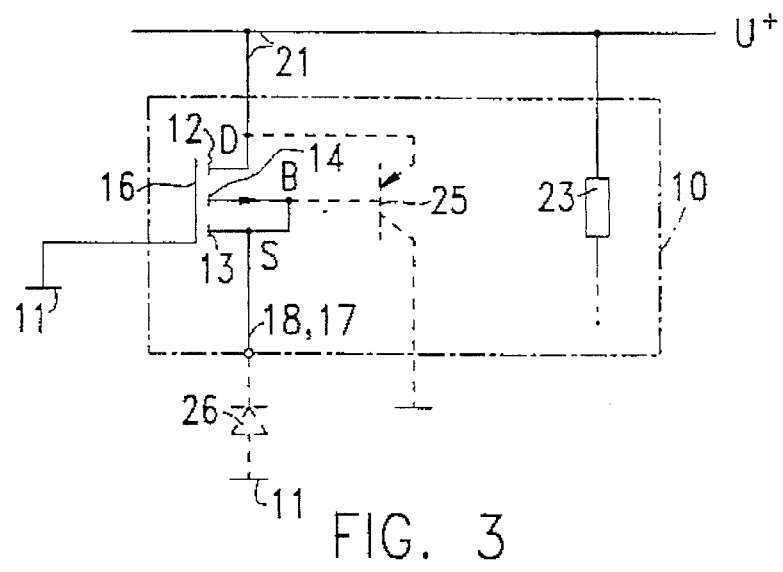

The p-channel transistor represented in FIGS. 1 and 2 is represented in FIG. 3 as a circuit symbol. In the described arrangement of the regions, a parasitic pnp-transistor 25 is effectively formed and connects the drain electrode 12 to the surrounding p-region 11 via an emitter/collector junction. The base is effectively connected to the bulk electrode 14, which is in turn connected to the source electrode 13. A diode 26 is effectively formed between the surrounding p-region 11 and the well 10. The effectively formed semiconductors are represented by dashes. The remaining wiring of the electrodes and terminals is already known from FIGS. 1 and 2.

The mode of operation of the p-channel transistor represented in FIGS. 1 to 3 is described below: as the $U^+$-voltage rises, the voltage at the source electrode 13 and the bulk electrode 14 follows this voltage as a consequence of the parasitic pnp-transistor 25, and likewise rises, but remains a diode forward voltage below $U^+$. If the gate/source voltage UGS overshoots the threshold voltage UTH of the p-channel, the latter becomes active and pulls the potential at the source electrode 13 and that of the well 10 connected thereto up to the potential of the drain electrode 12. The parasitic pnp-transistor 25 is thereby turned off, and leakage currents to the substrate 11 become very low.

In the event of a polarity reversal, the potential $U^+$ becomes negative with respect to frame, (ground) with the result that the p-channel remains turned off. $U^+$ can go negative as far as the drain/source breakdown voltage, without a substantial current flowing. The parasitic pnp-transistor 25 is blocked in any case in the event of polarity reversal.

I claim:

1. A p-channel transistor comprising:
   a drain electrode constructed as a first p-region in an n-well, the n-well being embedded in a third p-region, the drain electrode being coupled to a positive pole of a voltage supply and the third p-region being coupled to one of a ground and a negative pole of the voltage supply;
   a source electrode constructed as a second p-region in the n-well, the source electrode being coupled to the n-well via an ohmic contact; and
   a gate electrode coupled to a predetermined gate voltage, $U_g$, wherein $U_g < U^+ - |U_{TH}|$, wherein $U^+$ represents a voltage at the positive pole of the voltage supply and $|U_{TH}|$ represents an absolute value of a p-channel threshold voltage.

2. The transistor according to claim 1, wherein the third p-region surrounds the n-well.

3. The transistor according to claim 1, further comprising a bulk electrode formed as a p-channel between the drain electrode and the source electrode by applying the gate voltage to the gate electrode.

4. The transistor according to claim 1, wherein the n-well includes an $n^+$-region in contact with the source electrode via the ohmic contact.

5. The transistor according to claim 1, wherein the drain electrode is connected to a conductor track which is further connected to the positive pole of the voltage supply.

6. The transistor according to claim 1, wherein the gate electrode is connected to the third p-region.

7. The transistor according to claim 1, wherein the gate electrode contacts a $p^+$-region.

8. The transistor according to claim 1, wherein the gate electrode contacts a conductor track, the conductor track being connected to the third p-region.

\* \* \* \* \*